(12) United States Patent
Kontani et al.

(10) Patent No.: US 10,483,969 B2
(45) Date of Patent: Nov. 19, 2019

(54) INPUT DEVICE

(71) Applicant: Panasonic Intellectual Property Management Co., Ltd., Osaka (JP)

(72) Inventors: Masaki Kontani, Osaka (JP); Takeshi Masutani, Osaka (JP); Shinji Kadoriku, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/096,283

(22) PCT Filed: Apr. 4, 2017

(86) PCT No.: PCT/JP2017/014058
§ 371 (c)(1),
(2) Date: Oct. 24, 2018

(87) PCT Pub. No.: WO2018/061268
PCT Pub. Date: Apr. 5, 2018

(65) Prior Publication Data
US 2019/0149152 A1    May 16, 2019

(30) Foreign Application Priority Data
Sep. 29, 2016    (JP) .................................. 2016-192274

(51) Int. Cl.
*H03K 17/96* (2006.01)
*G06F 3/042* (2006.01)
(Continued)

(52) U.S. Cl.
CPC ....... *H03K 17/9638* (2013.01); *G02B 6/0068* (2013.01); *G06F 3/042* (2013.01);
(Continued)

(58) Field of Classification Search
CPC .......... H04M 1/22; H04M 1/23; H04M 1/233; H04M 1/236; H03K 17/9638; G06F 3/042;
(Continued)

(56) References Cited

U.S. PATENT DOCUMENTS

| 2001/0049893 A1* | 12/2001 | Maas | .................. G02B 6/0036 |
| --- | --- | --- | --- |
| | | | 40/544 |
| 2012/0200475 A1* | 8/2012 | Baker | ..................... G09F 13/04 |
| | | | 345/4 |

(Continued)

FOREIGN PATENT DOCUMENTS

| JP | 48-010920 B | 4/1973 | |
| --- | --- | --- | --- |
| JP | 2011-180430 A * | 9/2011 | ............. G09F 13/12 |
| JP | 2013-254597 | 12/2013 | |

OTHER PUBLICATIONS

International Search Report of PCT application No. PCT/JP2017/014058 dated Jul. 11, 2017.

*Primary Examiner* — Jimmy H Nguyen
(74) *Attorney, Agent, or Firm* — Greenblum & Bernstein, P.L.C.

(57) ABSTRACT

An input device includes: a switch to be switched by being pressed; a plurality of light sources including a first light source and a second light source; and a light guide that guides light emitted from each of the plurality of light sources. The light guide includes: an emission part that emits the light; a first light guide leg that is coupled to the emission part and guides first light to the emission part; and a second light guide leg that is coupled to the emission part and guides second light to the emission part. The emission part includes a first design that illuminates by reflecting the first light, and a second design that illuminates by reflecting the second light. The first light guide leg includes a first reflection surface that reflects the first light. The second light guide leg
(Continued)

includes a second reflection surface that reflects the second light.

10 Claims, 12 Drawing Sheets

(51) Int. Cl.
- *G06F 3/041* (2006.01)
- *H04M 1/23* (2006.01)
- *H01H 13/02* (2006.01)
- *F21V 8/00* (2006.01)
- G06F 3/023 (2006.01)
- G06F 3/0362 (2013.01)
- H04M 1/22 (2006.01)
- H01H 13/52 (2006.01)

(52) U.S. Cl.
CPC .......... *G06F 3/0414* (2013.01); *G06F 3/0238* (2013.01); *G06F 3/0362* (2013.01); *H01H 13/02* (2013.01); *H01H 13/52* (2013.01); *H04M 1/22* (2013.01); *H04M 1/23* (2013.01)

(58) Field of Classification Search
CPC .... G06F 3/0414; G06F 3/0362; G06F 3/0238; G06F 3/033; G02B 6/0068; G09F 13/00; G09F 13/18; H01H 13/02; H01H 13/52
See application file for complete search history.

(56) References Cited

U.S. PATENT DOCUMENTS

| | | | |
|---|---|---|---|
| 2014/0364694 A1* | 12/2014 | Avron | A61B 1/00105 600/164 |
| 2015/0062098 A1 | 3/2015 | Sakai | |
| 2018/0111546 A1* | 4/2018 | Salter | B60K 35/00 |
| 2019/0065800 A1* | 2/2019 | Nagata | G06K 7/10732 |

* cited by examiner

INPUT DEVICE

CROSS-REFERENCE TO RELATED APPLICATIONS

This application is a U.S. national stage application of the PCT International Application No. PCT/JP2017/014058 filed on Apr. 4, 2017, which claims the benefit of foreign priority of Japanese patent application 2016-192274 filed on Sep. 29, 2016, the contents all of which are incorporated herein by reference.

TECHNICAL FIELD

The present invention relates to an input device.

BACKGROUND ART

An illuminating-display input device is known, conventionally, which displays a display design on a display operation unit of a switch knob by guiding light emitted from a light source (see PTL 1).

CITATION LIST

Patent Literature

PTL 1: Unexamined Japanese Patent Publication No. 2013-254597

SUMMARY OF THE INVENTION

The present invention provides an input device that has a compact configuration and can effectively achieve selective display of two designs.

An input device according to an aspect of the present invention includes a switch, a plurality of light sources, and a light guide. The switch is switched between on and off by being pressed. The plurality of light sources include a first light source and a second light source disposed at a position different from the first light source. The light guide guides light emitted from each of the plurality of light sources in an anti-pressing direction opposite to a pressing direction of the switch. The light guide has an emission part, a first light guide leg, and a second light guide leg. The emission part is disposed in the anti-pressing direction from the switch and emits the light emitted by each of the plurality of light sources in the anti-pressing direction. The first light guide leg is coupled to the emission part and guides first light emitted by the first light source to the emission part. The second light guide leg is coupled to the emission part and guides second light emitted by the second light source to the emission part. The emission part has a first design and a second design. The first design illuminates by reflecting the first light in the anti-pressing direction. The second design illuminates by reflecting the second light toward the anti-pressing direction. The first light guide leg is a plate-shaped part and has a first reflection surface. The first reflection surface is disposed along a thickness of the first light guide leg and reflects the first light. The second light guide leg is a plate-shaped part and has a second reflection surface. The second reflection surface is disposed along a thickness of the second light guide leg and reflects the second light. The first light guide leg and the second light guide leg are arranged on approximately the same plane.

An input device of the present invention has a compact configuration and can effectively achieve selective display of two designs.

DESCRIPTION OF EMBODIMENT

Figure 1:
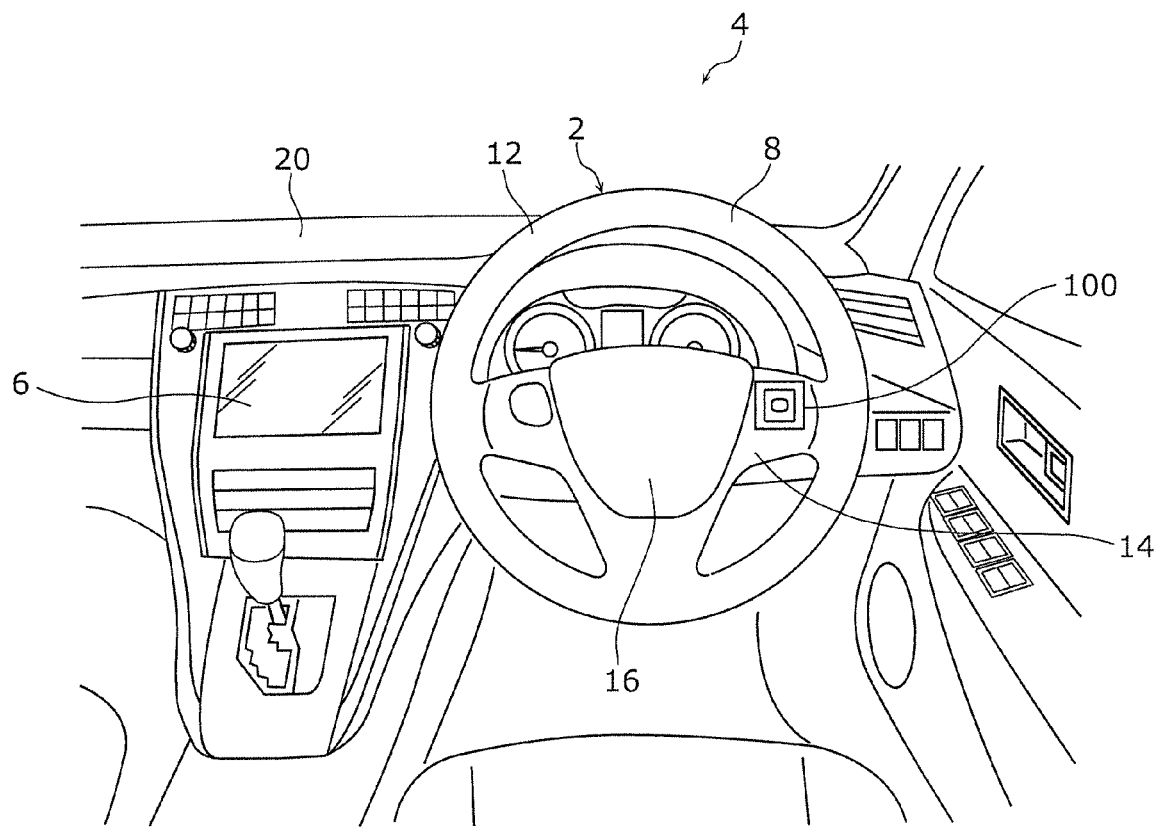
FIG. 1 is a diagram showing an example of a vehicle cabin of a vehicle on which a steering wheel input device according to an exemplary embodiment is disposed.

Before an exemplary embodiment of the present invention is described, problems in a conventional art will be briefly described. There is a need for selectively displaying one of two designs having different shapes on a surface of a part to be subjected to an operation of a switch. With the technique of PTL 1, however, it is not possible to display one of the two designs selectively. Further, there is a problem that, in order to display one of the two designs selectively, the configuration would become complex and the size would increase.

An input device according to an aspect of the present invention includes a switch, a plurality of light sources, and a light guide. The switch is switched between on and off by being pressed. The plurality of light sources have a first light source and a second light source disposed at a position different from the first light source. The light guide guides light emitted from each of the plurality of light sources in an anti-pressing direction opposite to a pressing direction of the switch. The light guide has an emission part, a first light guide leg, and a second light guide leg. The emission part is disposed in the anti-pressing direction from the switch and emits the light emitted by each of the plurality of light sources in the anti-pressing direction. The first light guide leg is coupled to the emission part and guides first light emitted by the first light source to the emission part. The second light guide leg is coupled to the emission part and guides second light emitted by the second light source to the emission part. The emission part includes a first design that illuminates by reflecting the first light in the anti-pressing direction and a second design that illuminates by reflecting the second light in the anti-pressing direction. The first light guide leg is a plate-shaped part and has a first reflection surface. The first reflection surface is disposed along a thickness of the first light guide leg and reflects the first light. The second light guide leg is a plate-shaped part and has a second reflection surface. The second reflection surface is disposed along a thickness of the second light guide leg and reflects the second light. The first light guide leg and the second light guide leg are arranged on approximately the same plane.

According to the above configuration, with respect to the first design and the second design that illuminate by reflecting light, the first light guide leg and the second light guide leg that guide light to the corresponding design are respectively provided, and the first light source and the second light source that emits light to the corresponding light guide leg are respectively provided. Thus, it is possible to selectively display two designs of the first design and the second design by selectively causing any of the first light source and the second light source to emit light.

Further, since the first light guide leg and the second light guide leg are arranged on approximately the same plane, it is possible to dispose the light guides, for example, to be parallel to a wall of a housing that is disposed on the outside of the light guides. Further, in this case, it is possible to dispose the light guide in such a manner that a distance from the first light guide leg to the wall of the housing and a distance from the second light guide leg to the wall of the housing are approximately the same. Therefore, it is possible to make a position of the emission part close to the wall of the housing, and, for example, the housing can be configured compactly. Accordingly, the input device can be configured compactly.

Further, the first reflection surface may be a side surface of the first light guide leg disposed to be tilted with respect to the pressing direction when viewed from the pressing direction. The second reflection surface may be a side surface of the second light guide leg disposed to be tilted with respect to the pressing direction when viewed from the pressing direction.

This arrangement makes it easy to arrange optical paths of the first light and the second light entering the emission part to intersect. Thus, it is possible to reduce reflection of the first light by the second design or reflection of the second light by the first design. That is, it is possible to reduce that a different design, which is not intended to be displayed, is slightly displayed due to reflection of uncorresponding light.

Further, the first reflection surface may be disposed in the anti-pressing direction from the first light source. The second reflection surface may be disposed in the anti-pressing direction from the second light source.

This arrangement makes it easy to arrange optical paths of the first light and the second light entering the emission part to intersect.

Further, a first direction in which the first light enters into the first design and a second direction in which the second light enters into the second design may intersect.

In this configuration, since the first direction and the second direction intersect each other, it is possible to reduce that the first light is reflected to the second design or the second light is reflected to the first design. That is, it is possible to reduce that a different design, which is not intended to be displayed, is slightly displayed due to reflection of uncorresponding light.

Further, the emission part is a plate-shaped part, and the first light guide leg and the second light guide leg may be coupled to the emission part through a part bent at a predetermined angle.

Therefore, even when the first light source and the second light source are mounted on one principle surface of the same substrate, it is easy to guide the first light and the second light to the emission part.

Further, at least a part of the first design and at least a part of the second design may be formed to overlap each other.

This arrangement enables the emission part to be configured compactly.

Further, the emission part may have at least one first step surface and at least one second step surface. The at least one first step surface is disposed on an extended line in the first direction in which the first light enters the first design, the at least one first step surface intersects the first direction, and the side, in the first direction, of the at least one first step surface is open to outside. The at least one second step surface is disposed on an extended line in the second direction in which the second light enters the second design, the at least one second step surface intersects the second direction, and the side, in the second direction, of the at least one second step surface is open to outside.

This arrangement can reduce reflection, of light that is a part of the light entering the first design but is not reflected by the first design, in a direction different from the first direction at an end part of the emission part. In a similar way, this arrangement can reduce reflection, of light that is a part of the light entering the second design but is not reflected by the second design, in a direction different from the second direction at an end part of the emission part. Therefore, it is possible to reduce staying of light not involved in display of the first design and the second design in the emission part; thus, when one of the first design and the second design is selectively displayed, it is possible to reduce display of another part with light being emitted.

Further, the at least one first step surface may include a plurality of first step surfaces, and the at least one second step surface may include a plurality of second step surfaces. On the emission part, there may be arranged a plurality of first step surfaces and a plurality of second step surfaces in a third direction intersecting the first direction and the second direction.

In this arrangement, since the plurality of first step surfaces and the plurality of second step surfaces are arranged in line in the same third direction, it is possible to arrange the plurality of first step surfaces and the plurality of second step surfaces in a limited area of the emission part. Therefore, it is possible to more effectively reduce staying of light not involved in display of the first design and the second design in the emission part; thus, when one of the first design and the second design is selectively displayed, it is possible to reduce display of another part with light being emitted.

Further, the at least one first step surface and the at least one second step surface may be colored black.

This arrangement makes it possible to reduce reflection of the first light or the second light by the first step surface and the second step surface. Therefore, it is possible to more effectively reduce staying of light not involved in display of the first design and the second design in the emission part; thus, when one of the first design and the second design is selectively displayed, it is possible to reduce display of another part with light being emitted.

Further, the switch, the first light source, and the second light source may be mounted on the same wiring board.

Therefore, it is possible to arrange the switch, the first light source, and the second light source in a simple configuration. In addition, the input device can be configured compactly.

Hereinafter, an input device according to an aspect of the present invention will be specifically described with reference to the drawings.

Note that each of the following exemplary embodiments illustrates a specific example of the present invention. Numerical values, shapes, materials, constituent elements, arrangement positions and connection modes of the constituent elements, steps, and an order of the steps that are illustrated in the following exemplary embodiment, are each an example and therefore are not intended to limit the present invention. Further, among the constituent elements in the following exemplary embodiment, the constituent elements not recited in the independent claim indicating the broadest concept are described as optional constituent elements.

Exemplary Embodiment

[1-1. Configuration of Steering Wheel Input Device]

Figure 2:
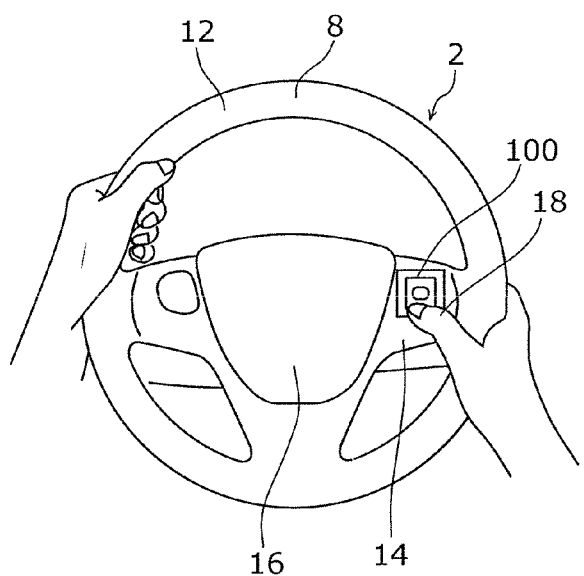
FIG. 2 is a diagram showing a usage example of the steering wheel input device according to the exemplary embodiment.

First, with reference to FIG. 1 and FIG. 2, a configuration of steering wheel input device 2 according to an exemplary embodiment will be described. FIG. 1 is a diagram showing an example of a vehicle cabin of a vehicle on which steering wheel input device 2 according to the exemplary embodiment is disposed. FIG. 2 is a diagram showing a usage example of steering wheel input device 2 according to the exemplary embodiment.

In the vehicle cabin of automobile 4 (an example of a vehicle) shown in FIG. 1, steering wheel input device 2 and in-vehicle equipment 6 are mounted. Steering wheel input device 2 according to the exemplary embodiment has steering wheel 8 and input device 100.

Steering wheel 8 is used to steer automobile 4. Steering wheel 8 has: rim 12 having a ring shape; spoke 14 having an approximately T-shape and integrally formed on an inner peripheral surface of rim 12; and a horn switch cover 16 disposed at a central part of spoke 14 and covering a horn switch (not shown).

Input device 100 is used to operate in-vehicle equipment 6 and is disposed, for example, on spoke 14 of steering wheel 8. As shown in FIG. 2, a driver as a user can operate in-vehicle equipment 6 by performing an input operation on input device 100 with finger 18 of the right hand (an example of an operating object) gripping rim 12. A configuration of input device 100 will be described in detail later.

In-vehicle equipment 6 is, for example, an audio equipment configured to reproduce optical discs such as a compact disc. In-vehicle equipment 6 is disposed, for example, in dashboard 20. A configuration of in-vehicle equipment 6 will be described in detail later.

[1-2. Configuration of Input Device]

Figure 3:
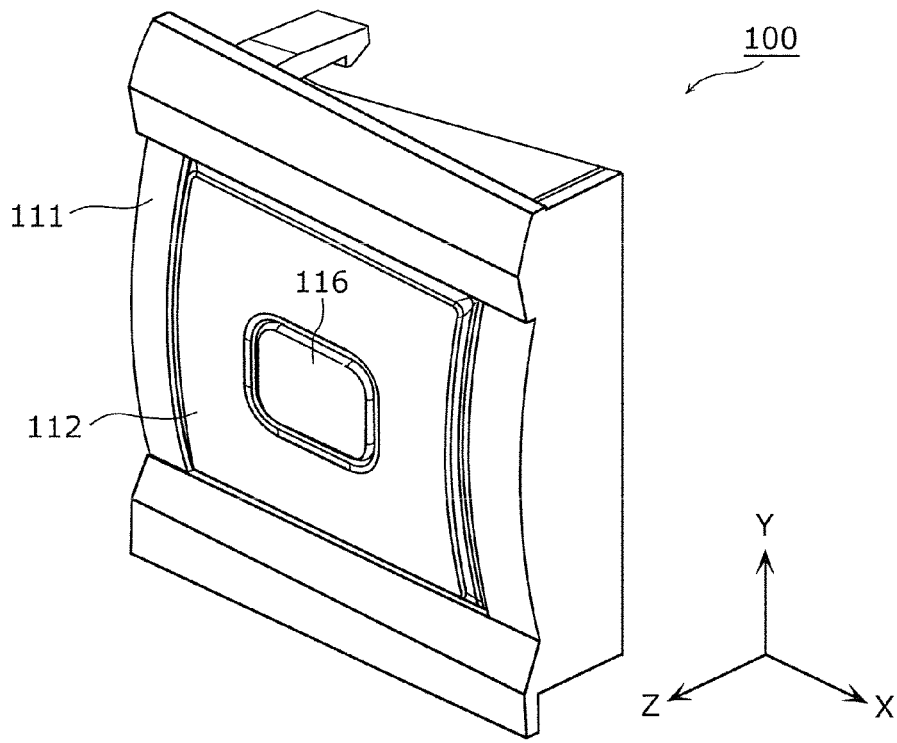
FIG. 3 is an outer appearance perspective view of an input device according to the exemplary embodiment.
Figure 4:
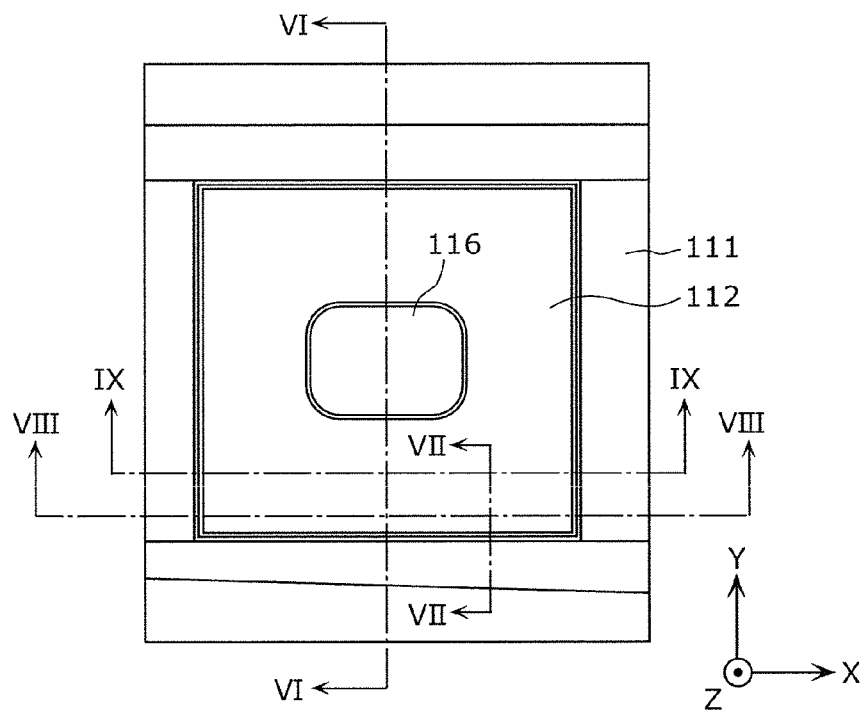
FIG. 4 is a front view of the input device according to the exemplary embodiment when viewed from the front side.
Figure 5:
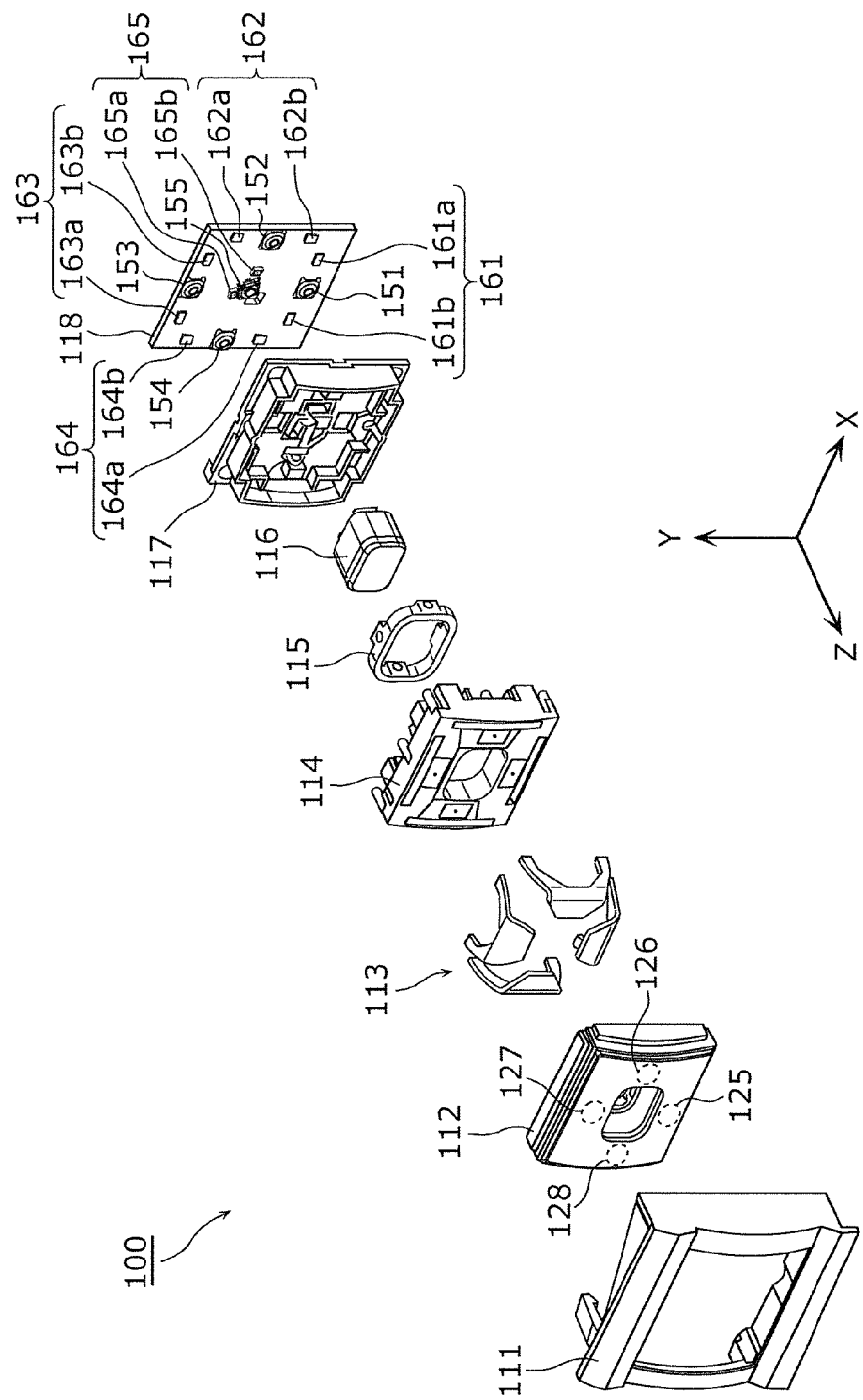
FIG. 5 is an exploded perspective view of the input device according to the exemplary embodiment.
Figure 6:
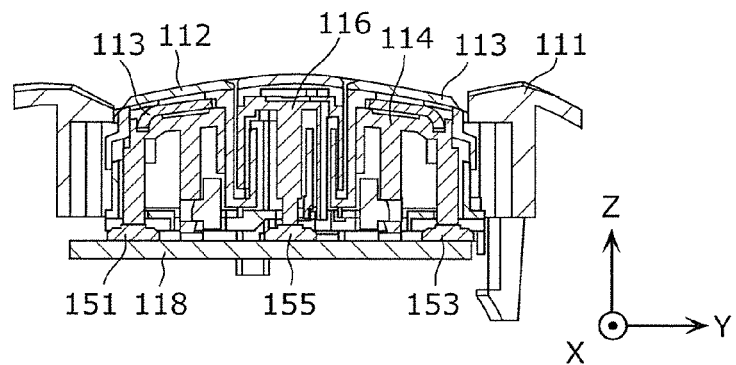
FIG. 6 is a cross-sectional view taken along line VI-VI in FIG. 4.
Figure 7:
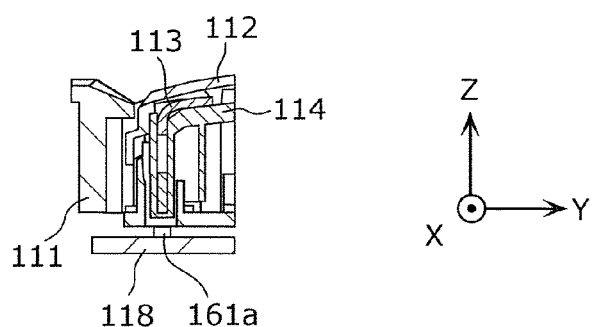
FIG. 7 is a cross-sectional view taken along line VII-VII in FIG. 4.
Figure 8:
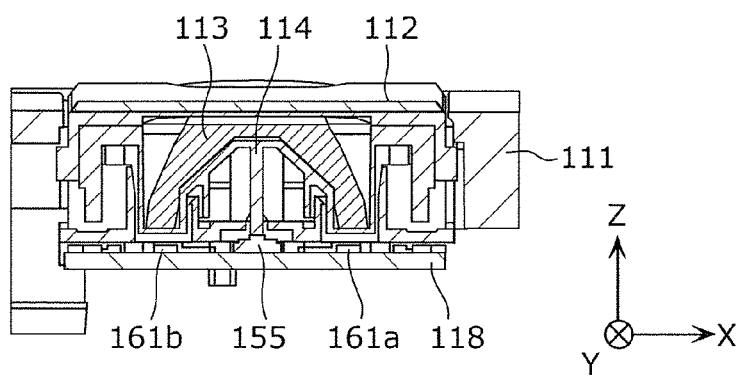
FIG. 8 is a cross-sectional view taken along line VIII-VIII in FIG. 4.
Figure 9:
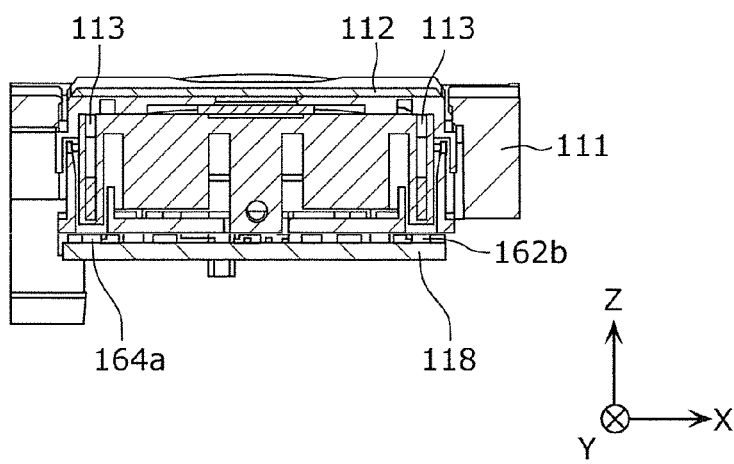
FIG. 9 is a cross-sectional view taken along line IX-IX in FIG. 4.

Next, with reference to FIG. 3 to FIG. 9, a configuration of input device 100 according to the exemplary embodiment will be described. FIG. 3 is an outer appearance perspective view of input device 100 according to the exemplary embodiment. FIG. 4 is a front view of input device 100 according to the exemplary embodiment when viewed from the front side. FIG. 5 is an exploded perspective view of input device 100 according to the exemplary embodiment. FIG. 6 is a cross-sectional view taken along line VI-VI in FIG. 4. FIG. 7 is a cross-sectional view taken along line VII-VII in FIG. 4. FIG. 8 is a cross-sectional view taken along line VIII-VIII in FIG. 4. FIG. 9 is a cross-sectional view taken along line IX-IX in FIG. 4.

As shown in FIG. 3 to FIG. 9, input device 100 according to the exemplary embodiment includes housing 111, first operation member 112, light guide 113, first supporter 114, axis body 115, second operation member 116, second supporter 117, and substrate 118.

Housing 111 is a member that covers a front side (a positive side in the Z-axis direction) of input device 100.

First operation member 112 is a member that selectively presses any one of four switches 151 to 154 mounted on substrate 118 provide on a rear side (a negative side in the Z-axis direction) when operated by a driver. First operation member 112 is swingably supported biaxially by first supporter 114, axis body 115, and second supporter 117. Specifically, first operation member 112 is swingably supported around the directions, as axes, each parallel to each of the X-axis direction and the Y-axis direction.

For example, when part 125, on a negative side in the Y-axis direction, of first operation member 112 is operated by a driver, part 125 is swingably moved around a first axis parallel to the X-axis direction of axis body 115, whereby switch 151 disposed at a position, on substrate 118, corresponding to part 125 is pressed. Further, regarding first operation member 112, when part 126, on a positive side in the X-axis direction, of first operation member 112 is operated by a driver, part 126 is swingably moved around a second axis parallel to the Y-axis direction of axis body 115, whereby switch 152 disposed at a position, on substrate 118, corresponding to part 126 is pressed. In a similar manner, when part 127, on a positive side in the Y-axis direction, of first operation member 112 is pressed, switch 153 disposed at a position corresponding to part 127 is pressed. Further, when part 128, on a negative side in the X-axis direction, of first operation member 112 is pressed, switch 154 disposed at a position corresponding to part 128 is pressed.

Light guide 113 guides light emitted from light sources 161 to 164 mounted on substrate 118, in an anti-pressing direction opposite to the pressing direction of switch 151 to switch 151. Specifically, regarding light guide 113, four light guides are provided on the front side of substrate 118, each corresponding to each of four switches 151 to 154. Light guide 113 is made of a transparent material, for example, acrylic resin, polycarbonate resin, or the like. A specific configuration of light guide 113 will be described later.

First supporter 114 is a member that supports first operation member 112 and light guide 113. Further, first supporter 114 supports axis body 115 swingably around the second axis.

Second supporter 117 is a member that supports second operation member 116. Further, second supporter 117 supports axis body 115 swingably around the first axis.

First supporter 114 and second supporter 117 are arranged not to interfere with each other. Therefore, first supporter 114 is coupled to second supporter 117 through axis body 115 and can thus biaxially swing. As a result, first operation member 112 can biaxially swing.

Second operation member 116 is supported slidably with respect to second supporter 117 in the Z-axis direction and presses switch 155 disposed at a center of substrate 118 when pressed to the negative side in the Z-axis direction.

First supporter 114, axis body 115, second operation member 116, and second supporter 117 are made of, for example, an opaque resin.

Substrate 118 is a wiring board having the plurality of switches 151 to 155 and the plurality of light sources 161 to 165 functioning as light sources. The plurality of switches 151 to 155 and the plurality of light sources 161 to 165 are mounted on a principle surface, of substrate 118, on the front side (the positive side in the Z-axis direction). Therefore, it is possible to arrange the plurality of switches 151 to 155 and the plurality of light sources 161 to 165 in a simple configuration.

Each of the plurality of switches 151 to 155 is a switch that switches between on and off by being pressed. Specifically, each of the plurality of switches 151 to 155 is a switch that switches between on and off of a previously set function by being pressed.

The plurality of light sources 161 to 164 are arranged corresponding to four light guides 113, and each of light sources 161 to 164 has two light sources, a first light source and a second light source, that correspond to one light guide 113. That is, light source 161 has first light source 161a and second light source 161b. Light source 162 has first light source 162a and second light source 162b. Light source 163 has first light source 163a and second light source 163b. Light source 164 has first light source 164a and second light source 164b. In a similar manner, light source 165 is disposed corresponding to a light guide (not shown) that guides light to second operation member 116, and has two light sources, first light source 165a and second light source 165b, that correspond to the light guide. Each of the plurality of light sources 161 to 165 is configured with, for example, an LED (Light Emitting Diodes).

Further, the plurality of switches 151 to 155 are arranged at positions different from each other on the principle surface of substrate 118. Similarly, the plurality of light sources 161 to 165 are arranged at positions different from each other on the principle surface of substrate 118. Further, first light sources 161a to 165a and second light sources 161b to 165b are arranged at positions different from each other on the principle surface of substrate 118.

Note that first operation member 112 is made of a material having translucency, and is made of, for example, resin. First operation member 112 is preferably smoke colored. This arrangement enables, when any of light sources 161 to 165 mounted on substrate 118 is emitting light, first design 141 and second design 142 formed in light guide 113 (see FIG. 10 to FIG. 14) to emit the emitted light to the positive side in the Z-axis direction. Further, when any of light sources 161 to 165 is not emitting light, it is possible to reduce a possibility that internal components are viewed by the driver.

[1-3. Configuration of Light Guide]

Figure 10:
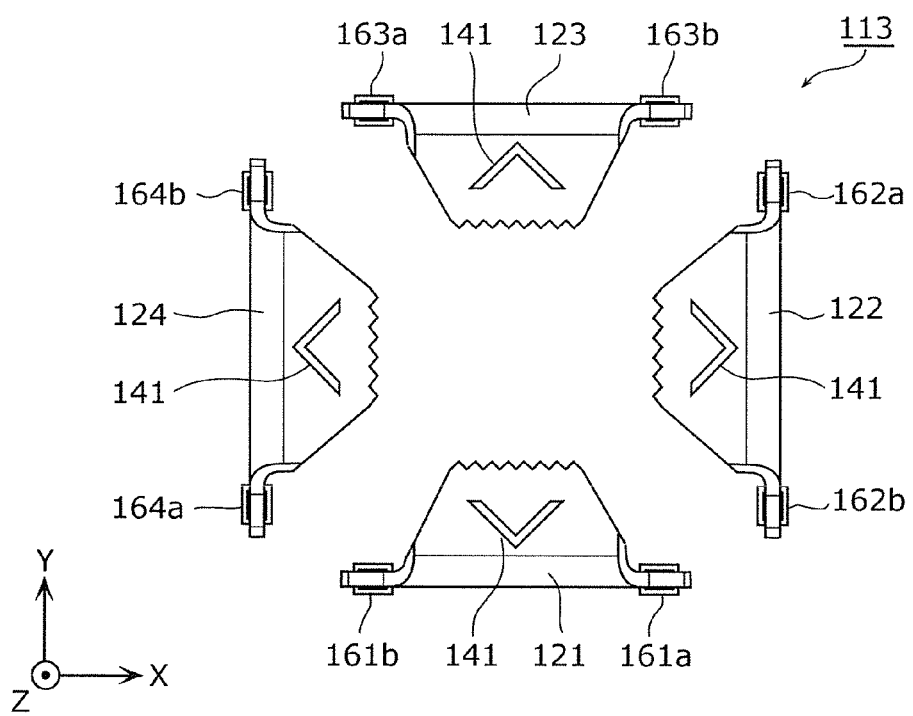
FIG. 10 is a front view, viewed from the positive side in a Z-axis direction, of a light guide when first designs are displayed.
Figure 11:
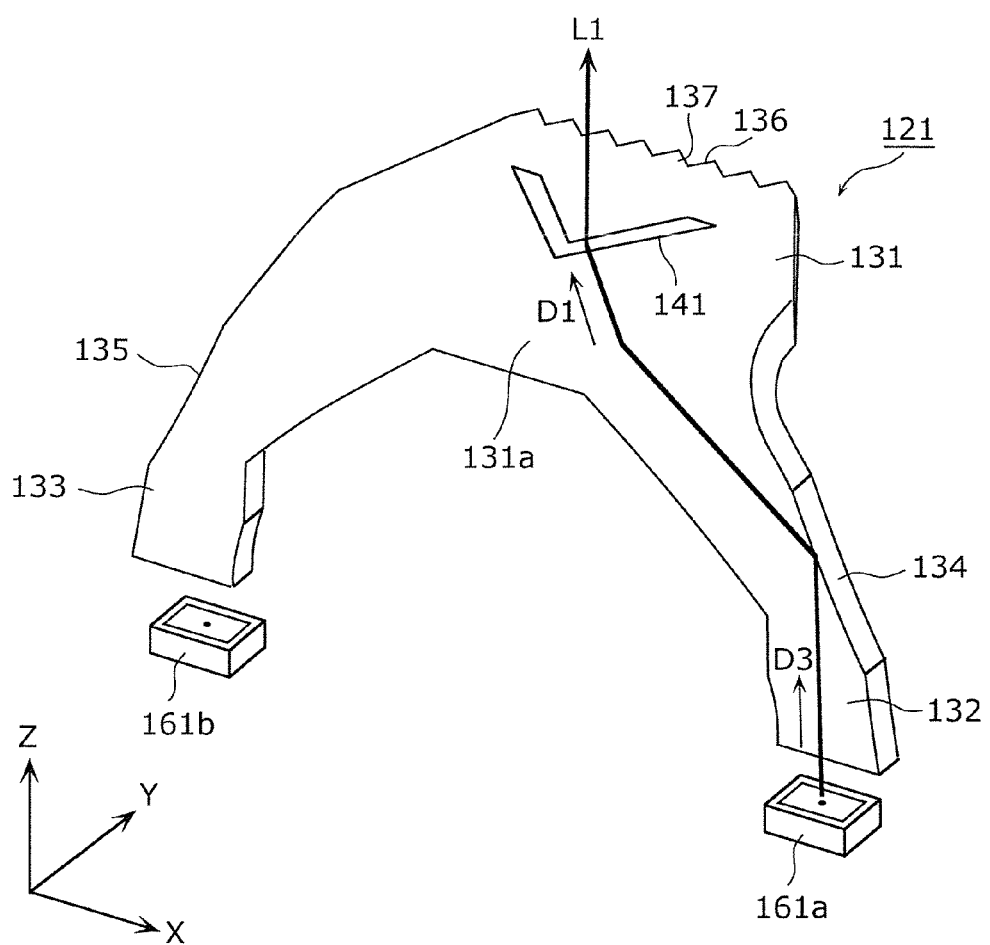
FIG. 11 is a perspective view showing a relation between a first light guide and each of a first light source and a second light source when the first design is displayed.
Figure 12:
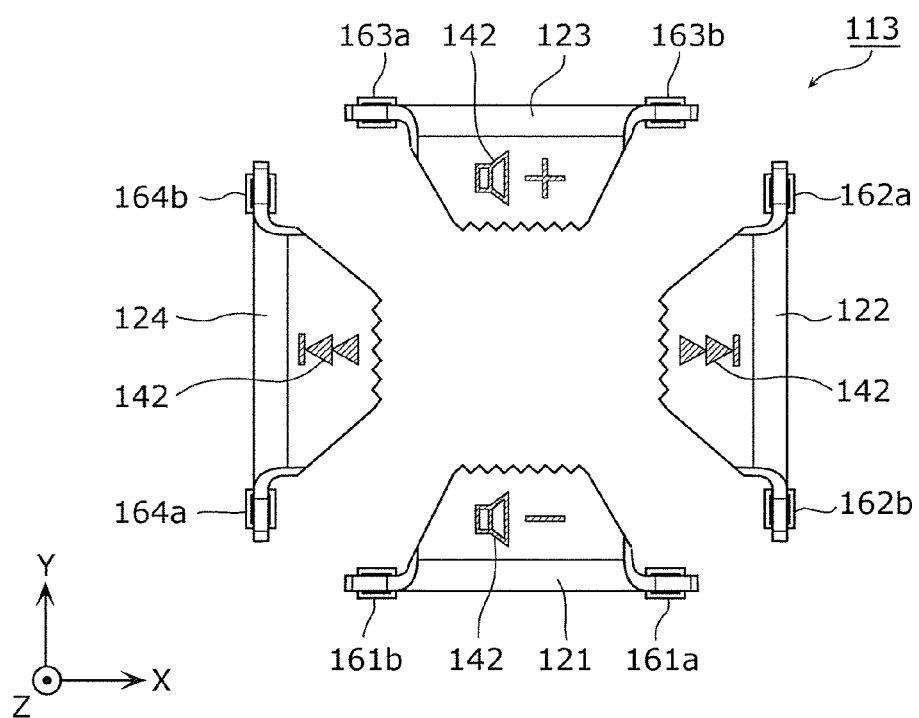
FIG. 12 is a front view, viewed from the positive side in the Z-axis direction, of the light guide when second designs are displayed.
Figure 13:
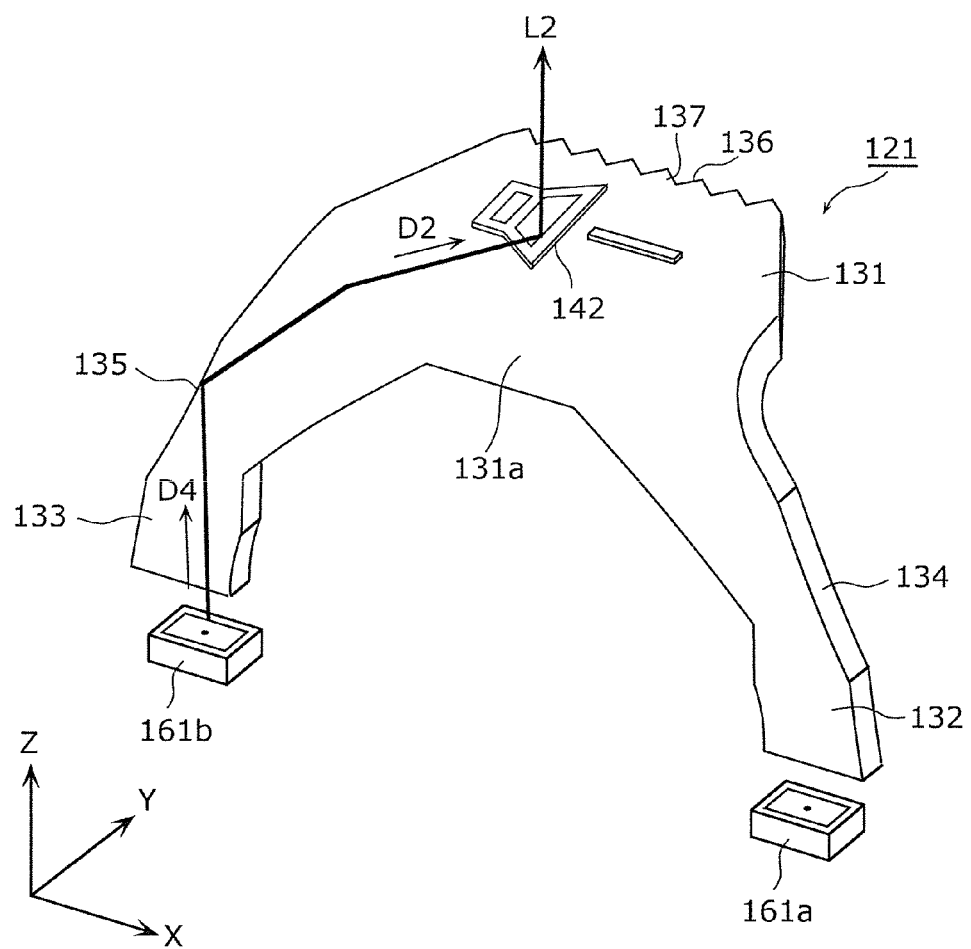
FIG. 13 is a perspective view showing a relation between the first light guide and each of the first light source and the second light source when the second design is displayed.

Next, with reference to FIG. 10 to FIG. 13, a configuration of light guide 113 according to the exemplary embodiment will be described. FIG. 10 is a front view, viewed from the positive side in the Z-axis direction, of light guide 113 when the first design is displayed. FIG. 11 is a perspective view showing a relation between first light guide 121 and each of first light source 161a and second light source 161b when the first design is displayed. FIG. 12 is a front view, viewed from the positive side in the Z-axis direction, of light guide 113 when the second design is displayed. FIG. 13 is a perspective view showing a relation between first light guide 121 and each of first light source 161a and second light source 161b when the second design is displayed.

As shown in FIG. 10 and FIG. 12, light guide 113 has first light guide 121, second light guide 122, third light guide 123, and fourth light guide 124. First light guide 121 is disposed on the negative side in the Y-axis direction, second light guide 122 is disposed on the positive side in the X-axis direction, third light guide 123 is disposed on the positive side in the Y-axis direction, and fourth light guide 124 is disposed on the negative side in the X-axis direction.

As shown in FIG. 10, in each of first light guide 121 to fourth light guide 124 is formed first design 141. First designs 141 each have a hook shape indicating the direction to which each of first light guide 121 to fourth light guide 124 is disposed. In other words, first designs 141 have a shape representing a cross key indicating both the sides in the X-axis direction and both the sides in the Y-axis direction. Further, as shown in FIG. 12, each of first light guide 121 to fourth light guide 124 has second design 142 formed. Second design 142 has a different shape from first design 141. Second design 142 has a shape indicating, for example, next song, previous song, volume up, or volume down. Note that first design 141 and second design 142 may have any shapes as long as the shapes are different from each other.

Next, the shape of first light guide 121 will be described with reference to FIG. 11 and FIG. 13. Note that second light guide 122, third light guide 123, and fourth light guide 124 have a similar shape to first light guide 121 and are different only in at least one of first design 141 and second design 142; therefore, second light guide 122, third light guide 123, and fourth light guide 124 will not be described.

As shown in FIG. 11 and FIG. 13, first light guide 121 has emission part 131, first light guide leg 132, and second light guide leg 133.

Figure 14:
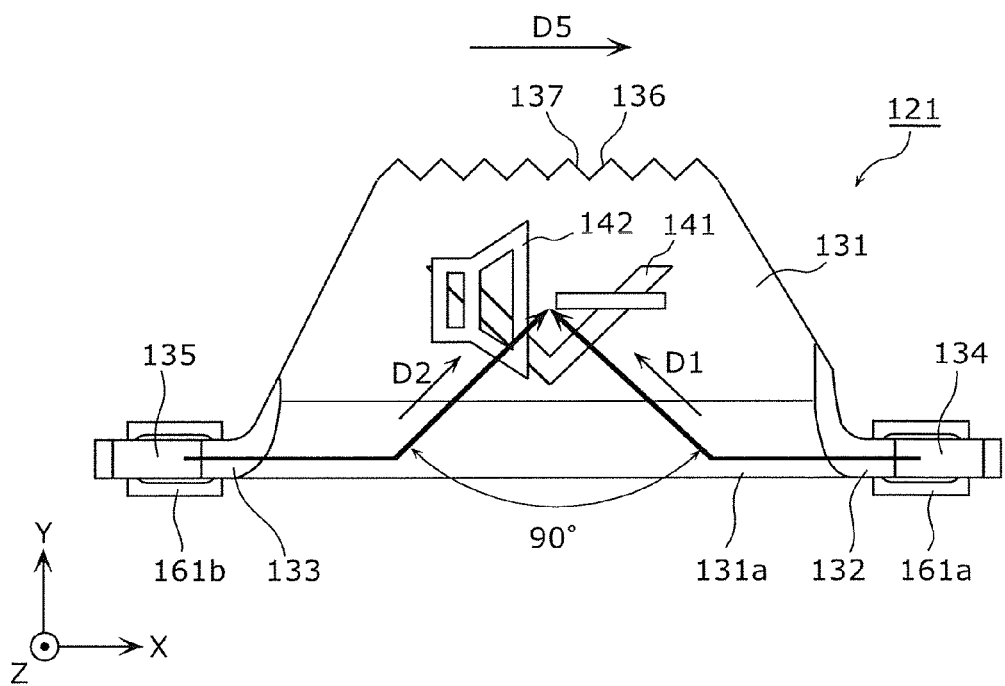
FIG. 14 is a diagram for illustrating routes, of light emitted from the first light source and the second light source, in an emission part of the first light guide.

Emission part 131 is provided on an anti-pressing direction side (the positive side in the Z-axis direction) of switch 151 and emits light emitted by first light source 161a or second light source 161b toward the positive side in the Z-axis direction. Emission part 131 is a flat plate-shaped part and is disposed approximately parallel to an X-Y plane. Emission part 131 has first design 141 and second design 142. First design 141 illuminates by reflecting first light emitted by first light source 161a toward the positive side in the Z-axis direction. Second design 142 illuminates by reflecting second light emitted by second light source 161b toward the positive side in the Z-axis direction. Further, at least a part of first design 141 and at least a part of second design 142 are formed to overlap each other as shown in FIG. 14 to be described later.

The first light guide leg 132 is coupled to emission part 131 and guides first light emitted by first light source 161a to emission part. 131. First light guide leg 132 is a plate-shaped part and has first reflection surface 134. First reflection surface 134 is parallel to a thickness direction of first light guide leg 132 and reflects the first light. First reflection surface 134 is a surface tilted with respect to the Z-axis direction when viewed from the Z-axis direction (pressing direction) so that the first light emitted by first light source 161a will be guided to emission part 131. Therefore, the angle of the tilt is determined depending on a height of first light guide 121, distance between first light guide leg 132 and second light guide leg 133, and the like. First reflection surface 134 may be a side surface of first light guide leg 132 disposed to be tilted with respect to the Z-axis direction (the pressing direction) when viewed from the Z-axis direction. First reflection surface 134 may be disposed on the positive side in the Z-axis direction (the opposite direction of the pressing direction, in other words, the anti-pressing direction) of first light source 161*a*. First reflection surface 134 may be a flat surface or a curved surface.

Further, specifically, first light guide leg 132 is a part extending approximately parallel to the Z-axis direction from an end part, on the negative side in the Y-axis direction, of emission part 131, toward first light source 161*a*, and through curved surface part 131*a* curved at a predetermined angle. In other words, first light guide leg 132 is coupled to emission part 131 through curved surface part 131*a*.

The second light guide leg 133 is coupled to emission part 131 and guides second light emitted by second light source 161*b* to emission part 131. Second light guide leg 133 is a plate-shaped part and has second reflection surface 135. Second reflection surface 135 is parallel to a thickness direction of second light guide leg 133 and reflects the second light. In a similar manner to first reflection surface 134, second reflection surface 135 is also a surface tilted with respect to the Z-axis direction when viewed from the Z-axis direction (pressing direction) so that the second light emitted by second light source 161*b* will be guided to emission part 131. Therefore, the angle of the tilt is determined depending on a height of first light guide 121, distance between first light guide leg 132 and second light guide leg 133, and the like. Second reflection surface 135 may be a side surface of second light guide leg 133 disposed to be tilted with respect to the Z-axis direction (the pressing direction) when viewed from the Z-axis direction. Second reflection surface 135 may be disposed on the positive side in the Z-axis direction (the opposite direction of the pressing direction, in other words, the anti-pressing direction) of second light source 161*b*. Second reflection surface 135 may be a flat surface or a curved surface.

Specifically, second light guide leg 133 is a part extending approximately parallel to the Z-axis direction from an end part, on the negative side in the Y-axis direction, of emission part 131, toward second light source 161*b*, and through curved surface part 131*a* curved at a predetermined angle. In other words, second light guide leg 133 is coupled to emission part 131 through curved surface part 131*a*.

As described above, first light guide leg 132 and second light guide leg 133 are coupled to emission part 131 through the same curved surface part 131*a*. Therefore, first light guide leg 132 and second light guide leg 133 are arranged at the same plane. Thus, first light guide leg 132 and second light guide leg 133 are arranged on the same side of emission part 131 (in other words, the negative side in the Y-axis direction). As a result, the width, of the first light guide 121, in the Y-axis direction can be small, and input device 100 can thus be compact.

Further, the arrangement is made such that first reflection surface 134 of first light guide leg 132 and second reflection surface 135 of second light guide leg 133 are more distant toward the negative side in the Z-axis direction. Further, first reflection surface 134 is a surface open to the positive side in the Z-axis direction and the positive side in the X-axis direction. Second reflection surface 135 is a surface open to the positive side in the Z-axis direction and the negative side in the X-axis direction.

Here, as described above, first light guide 121 to fourth light guide 124 are respectively arranged to bridge over first light sources 161*a* to 164*a* and second light sources 161*b* to 164*b* each belonging to each of four light sources 161 to 164. In other words, with respect to the plurality of light sources 161 to 164, first light guide 121 to fourth light guide 124 selectively turn on the light emitted by first light sources 161*a* to 164*a* and second light sources 161*b* to 164*b*. This arrangement enables first design 141 to be displayed by the first light of first light sources 161*a* to 164*a* and enables second design 142 to be displayed by the second light of second light sources 161*b* to 164*b*.

In the present exemplary embodiment, input device 100 operates in a plurality of operation modes. For example, input device 100 operates in two operation modes of a menu selection mode as a first operation mode and a music player mode as a second operation mode. Regarding input device 100, depending on the operation mode to which switching has been made by a predetermined switching unit, functions previously set to each of the plurality of switches 151 to 155 are switched. As the predetermined switching unit, various switching units can be considered such as turning on and off of another switch, speech recognition, and gesture recognition.

Further, in input device 100, depending on the operation modes, functions set to the switches correspond to functions illuminated by each set of the light sources. For example, in the first operation mode, the plurality of switches 151 to 155 function as a cross key to move a selected item to select a menu and as a determination key to set the selected item. Further, in the second operation mode, the plurality of switches 151 to 155 respectively function as keys for next song, previous song, volume up, volume down, and play/pose of the music player Accordingly, in the present exemplary embodiment, one of first light sources 161*a* to 164*a* and second light sources 161*b* to 164*b* is selectively turned on depending on the operation mode; thus, first design 141 is displayed in the first operation mode, and second design 142 is displayed in the second operation mode. Similarly, one of first light source 165*a* and second light 165*b* may be selectively turned on depending on the operation mode so that second operation member 116 will be made to display the first design in the first operation mode and to display the second design different from the first design in the second operation mode.

Specifically, each of the plurality of light sources 161 to 165 has a set of each of first light sources 161*a* to 165*a* and each of second light sources 161*b* to 165*b*. When any of first light sources 161*a* to 165*a* of the plurality of light sources 161 to 165 is on, second light sources 161*b* to 165*b* are off, and when any of second light sources 161*b* to 165*b* is on, first light sources 161*a* to 165*a* are off. In other words, depending on whether the operation mode is the first operation mode or the second operation mode, a transition is made to any of a first state and a second state. In the first state, any of first light sources 161*a* to 165*a* is on, and second light sources 161*b* to 165*b* are off. In the second state, any of second light sources 161*b* to 165*b* is on, and first light sources 161*a* to 165*a* are off. In the exemplary embodiment, when the operation mode of the plurality of switches 151 to 155 is the first operation mode, the plurality of light sources 161 to 165 take the first state where first design 141 is displayed. When the operation mode of the plurality of switches 151 to 155 is the second operation mode, the plurality of light sources 161 to 165 take the second state where second design 142 is displayed.

Note that if the plurality of switches 151 to 155 are put in an off state by an external switch or the like, the plurality of light sources 161 to 165 may all be off.

As shown in FIG. 11, the first light from first light source 161a travels through first light guide leg 132 toward the positive side in the Z-axis direction (third direction D3), is deflected in the direction parallel to emission part 131 while being reflected by first reflection surface 134 and curved surface part 131a, and enters emission part 131. Further, as shown in FIG. 13, the second light from second light source 161b travels through second light guide leg 133 toward the positive side in the Z-axis direction (fourth direction D4), is deflected in the direction parallel to emission part 131 while being reflected by second reflection surface 135 and curved surface part 131a, and enters emission part 131.

Next, the first light and the second light guided to emission part 131 by first light guide leg 132 and second light guide leg 133 respectively travel toward first design 141 and second design 142 in emission part 131. At this time, even when some measures to prevent or reduce stray light are taken in first light guide leg 132 and second light guide leg 133, there is a possibility that the first light and the second light entering emission part 131 may generate stray light not contributing to display first design 141 or second design 142 in emission part 131. To address this issue, in order to prevent or reduce generation of stray light, emission part 131 preferably has a configuration to be described below. The above-mentioned configuration will be described with reference to FIG. 14 and FIG. 15.

Figure 15:
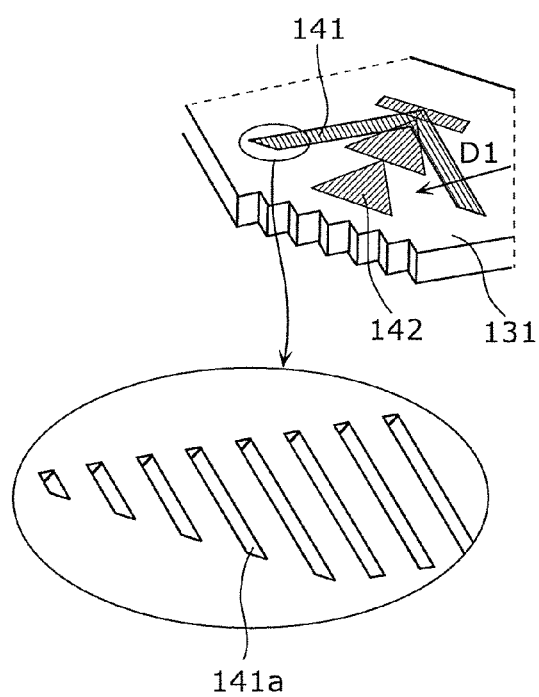
FIG. 15 is a partially enlarged view of the first design of the emission part.

FIG. 14 is a diagram for illustrating routes, of light emitted from first light source 161a and second light source 161b, in emission part 131 of first light guide 121. FIG. 15 is a partially enlarged view of first design 141 of emission part 131.

As shown in FIG. 14, the first light guided to emission part 131 by first light guide leg 132 enters first design 141 in first direction D1, and the second light guided by second light guide leg 133 to emission section 131 enters second design 142 in second direction D2, where first direction D1 and second direction D2 intersect each other. Specifically, first direction D1 and second direction D2 are approximately orthogonal to each other.

Further, as shown in FIG. 15, first design 141 is configured with a plurality of inclined surfaces 141a approximately parallel to second direction D2 intersecting first direction D1. Further, not shown in the drawing, second design 142 is configured with a plurality of inclined surfaces approximately parallel to first direction D1. With this configuration, first design 141 reflects the first light traveling in first direction D1 but is less likely to reflect the second light traveling in second direction D2. Further, second design 142 has a configuration in which the second light traveling in second direction D2 is reflected but the first light traveling in first direction D1 is less likely to be reflected.

As described above, since first direction D1 and second direction D2 intersect each other, it is possible to reduce reflection of the first light by second design 142 or reflection of the second light by first design 141. That is, it is possible to reduce that a different design, which is not intended to be displayed, is slightly displayed due to reflection of uncorresponding light by first design 141 or second design 142.

In addition, emission part 131 has first step surfaces 136 and second step surfaces 137. First step surfaces 136 are arranged on an extended line in first direction D1, in which the first light enters first design 141, and intersect first direction D1. In addition, the sides, in first direction D1, of first step surfaces 136 are opened to outside. Second step surfaces 137 are arranged on an extended line in second direction D2, in which the second light enters second design 142, and intersect second direction D2. In addition, the sides, in second direction D2, of second step surfaces 137 are opened to outside.

This arrangement can reduce reflection, of light that is a part of the light entering first design 141 but is not reflected by first design 141, in a direction different from first direction D1 at an end part, of emission part 131, on the positive side in the Y-axis direction. Similarly, it is possible to reduce reflection, of light that is a part of the light entering second design 142 but is not reflected by second design 142, in a direction different from second direction D2 at an end part, of emission part 131, on the positive side in the Y-axis direction. Therefore, it is possible to reduce staying of light not involved in display of first design 141 and second design 142 in emission part 131; thus, when one of first design 141 and second design 142 is selectively displayed, it is possible to reduce display of another part of emission part 131 with light being emitted.

Further, first step surfaces 136 are formed in plural numbers, and the plurality of first step surfaces 136 are arranged at different positions in fifth direction D5 (X-axis direction) intersecting first direction D1 and second direction D2. In a similar manner, second step surfaces 137 are formed in plural numbers, and the plurality of second step surfaces 137 are arranged at different positions in the X-axis direction. Then, individual first step surfaces 136 and individual second step surfaces 137 are alternately arranged in the X-axis direction.

As described above, since individual first step surfaces 136 and individual second step surfaces 137 are alternately arranged in the X-axis direction, it is possible to arrange the plurality of first step surfaces 136 and the plurality of second step surfaces 137 in a limited area of emission part 131. Therefore, it is possible to more effectively reduce staying of light not involved in display of first design 141 and second design 142, in emission part 131; thus, when one of first design 141 and second design 142 is selectively displayed, it is possible to reduce display of another part with light being emitted.

Further, first step surfaces 136 and second step surfaces 137 are preferably colored black. This arrangement makes it possible to reduce reflection of the first light or the second light by first step surface 136 and second step surface 137. Therefore, it is possible to more effectively reduce staying of light not involved in display of first design 141 and second design 142, in emission part 131; thus, when one of first design 141 and second design 142 is selectively displayed, it is possible to reduce display of another part with light being emitted.

[1-4. Effect]

In input device 100 according to the present exemplary embodiment, with respect to first design 141 and second design 142 that illuminate by reflecting light, there are provided with first light guide leg 132 and second light guide leg 133 each for guiding light to the corresponding design and with first light source 161a and second light source 161b each for emitting light to the corresponding light guide leg. Thus, it is possible to selectively display two designs of first design 141 and second design 142 by selectively causing any one of first light source 161a and second light source 161b to emit light.

Further, since first light guide leg 132 and second light guide leg 133 are arranged on approximately the same plane, it is possible to configure such that the distance between light guide 113 and housing 111 is short. That is, input device 100 can be configured compactly. The reason for this effect will be described with reference to FIG. 16 and FIG. 17.

Figure 16:
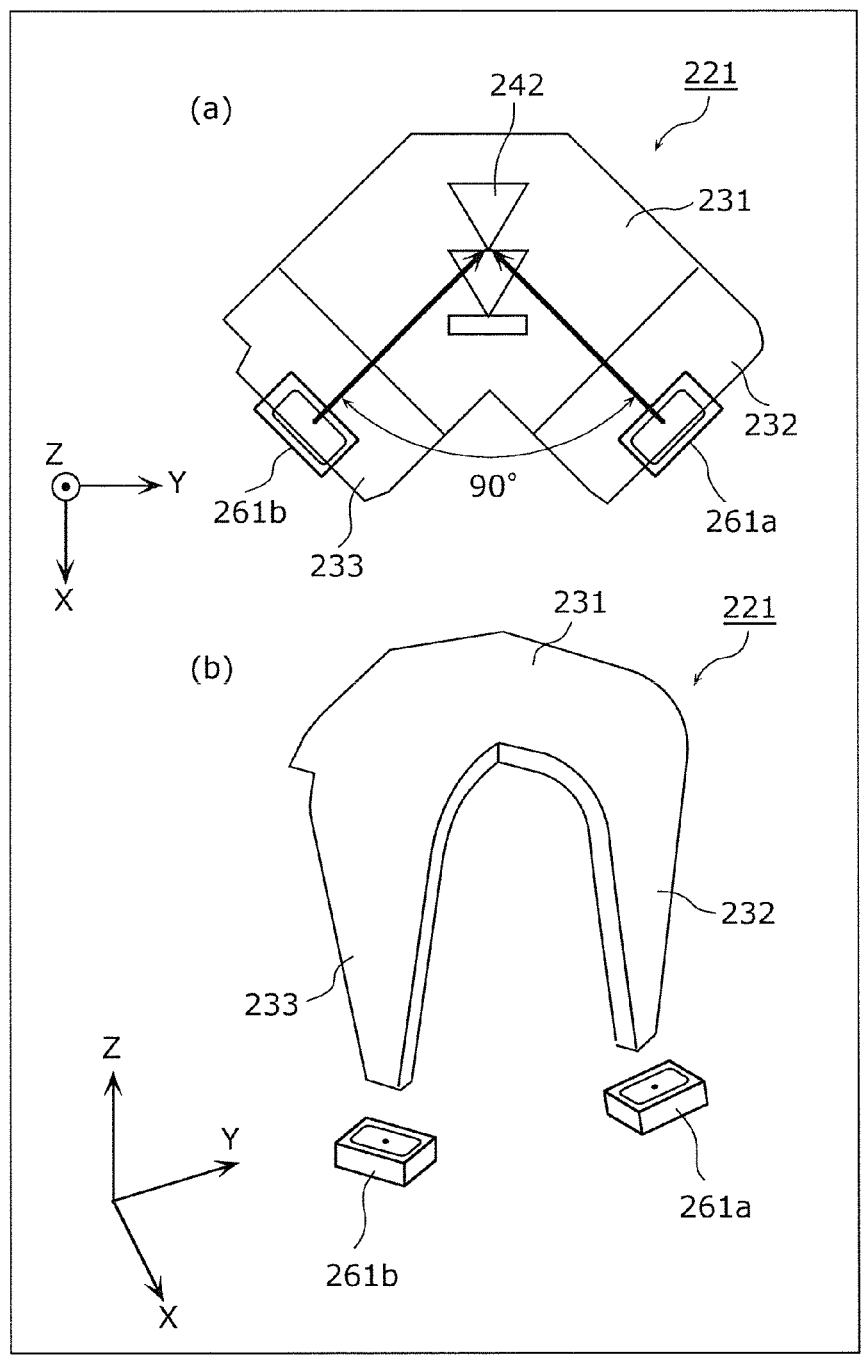
FIG. 16 is a diagram showing a relation between a light guide and each of a first light source and a second light source in a configuration in which a first light guide leg and a second light guide leg are not arranged on approximately the same plane.
Figure 17:
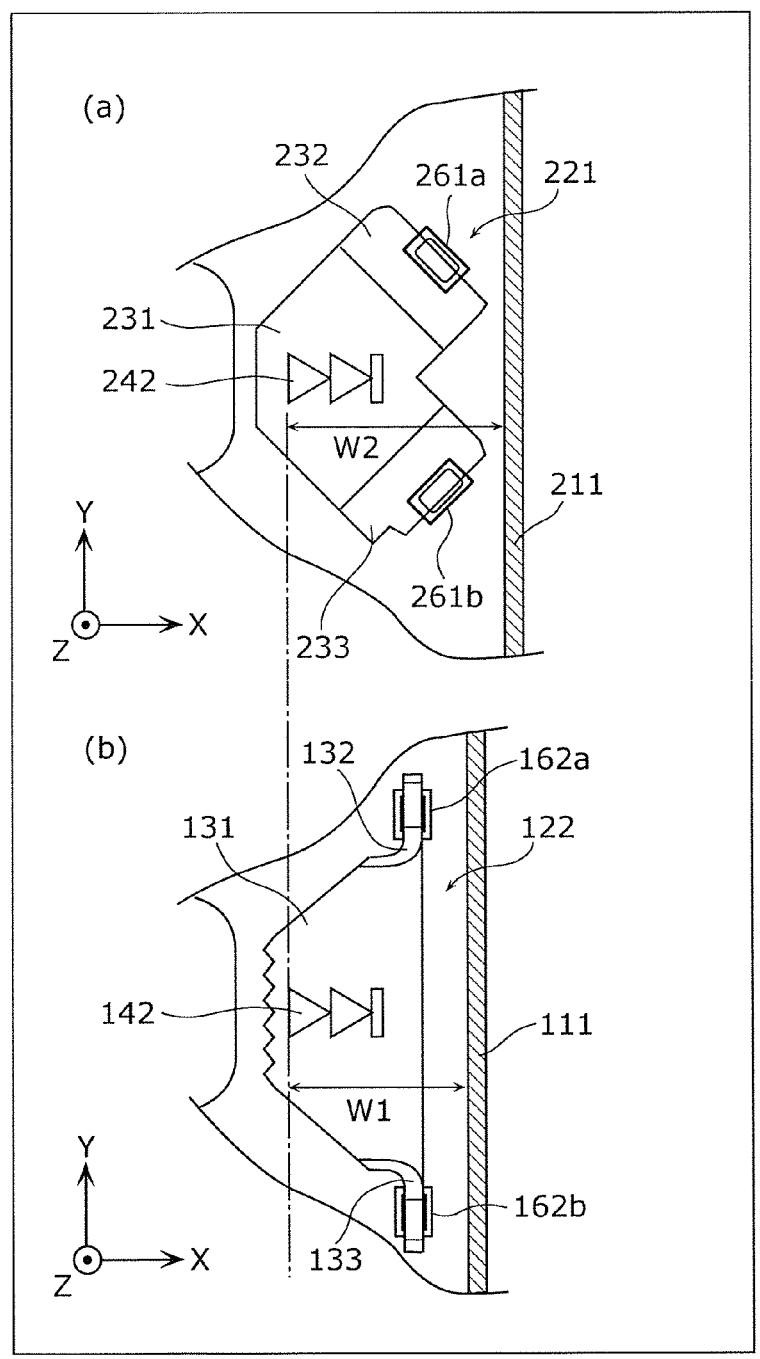
FIG. 17 is a diagram for comparing the light guide and a distance W2 to a housing with a second light guide and a distance W1 to a housing.

FIG. 16 is a diagram showing a relation between light guide 221 and each of first light source 261a and second light source 261b in the configuration in which first light guide leg 232 and second light guide leg 233 are not arranged on approximately the same plane. FIG. 17 is a diagram for comparing light guide 221 and a distance W2 to housing 211 with second light guide 122 and a distance W1 to housing 111. Hereinafter, instead of first light guide 121, second light guide 122 having the same configuration as first light guide 121 is used for description.

Light guide 221 shown in FIG. 16 has emission part 231, first light guide leg 232, and second light guide leg 233 in a similar manner to second light guide 122 of the above exemplary embodiment. Part (a) of FIG. 16 is an upper surface view when viewed from the positive side in the Z-axis direction, and part (b) of FIG. 16 is a perspective view. In a similar manner to emission part 131 of the above exemplary embodiment, emission part 231 has a first design and a second design that are the same as first design 141 and second design 142 shown in FIG. 15. Note that only second design 242 is shown in part (a) of FIG. 16, and the first design is not shown. Further, in light guide 221, first light of first light source 261a guided from first light guide leg 232 and second light of second light source 261b guided from second light guide leg 233 orthogonally intersect each other in emission part 231. Therefore, the configuration is made such that, in a similar manner to emission part 131 of second light guide 122 of the above exemplary embodiment, when first light source 261a or second light source 261b is selectively made to emit light, first design (corresponding to first design 141 of FIG. 15) or second design 242, which is not shown, can be selectively made to illuminate.

However, first light guide leg 232 and second light guide leg 233 of light guide 221 are different from the case of second light guide 122 of the above exemplary embodiment in that first light guide leg 232 and second light guide leg 233 are arranged in a posture to intersect each other. In other words, first light guide leg 232 and second light guide leg 233 are not arranged on approximately the same plane.

Light guide 221, in which first light guide leg 232 and second light guide leg 233 are not arranged on approximately the same plane as described above, is disposed in a posture in which first light guide leg 232 and second light guide leg 233 are arranged to intersect each other as shown in part (a) of FIG. 17. Therefore, light guide 221 disposed on the positive side in the X-axis direction is disposed in a posture in which first light guide leg 232 and second light guide leg 233 are arranged to obliquely face a wall, of housing 211, on the positive side in the X-axis direction. As a result, the position of emission part 231 is more distant to the wall, of housing 211, on the positive side in the X-axis direction, and second design 242 is located at a position which is the distance W2 apart from the wall, of housing 211, on the positive side in the X-axis direction.

On the other hand, as shown in part (b) of FIG. 17, regarding second light guide 122 of the above exemplary embodiment, first light guide leg 132 and second light guide leg 133 are arranged on approximately the same plane. Therefore, second light guide 122 disposed on the positive side in the X-axis direction can be disposed such that first light guide leg 132 and second light guide leg 133 are in a posture in which first light guide leg 132 and second light guide leg 133 are parallel to the wall, of housing 111, on the positive side in the X-axis direction. Further, the distance from first light guide leg 132 to the wall, of housing 111, on the positive side in the X-axis direction can be equal to the distance from second light guide leg 133 to the wall, of housing 111, on the positive side in the X-axis direction. As a result, the position of emission part 131 can be closer to the wall, of housing 111, on the positive side in the X-axis direction; thus, second design 142 can be located at a position which is the distance W1 apart from the wall, of housing 111, on the positive side in the X-axis direction and at which the distance W1 is shorter than the distance W2.

The above description goes for each of first light guide 121 to fourth light guide 124. Specifically, regarding each of first light guide 121 to fourth light guide 124, since first light guide leg 132 and second light guide leg 133 are arranged on approximately the same plane, the distance from the position of each of the designs to the outer wall, of housing 111, in the X-axis direction and the Y-axis direction can be short. As a result, input device 100 can be configured compactly.

Modified Example

In the above exemplary embodiment, third direction D3 and fourth direction D4 are approximately parallel to the Z-axis direction and are approximately the same direction. However, third direction D3 and fourth direction D4 may be different from each other. In other words, although first light guide leg 132 and second light guide leg 133 extend in the direction approximately parallel to the Z-axis direction, first light guide leg 132 and second light guide leg 133 may extend in directions intersecting each other.

In the above exemplary embodiment, first light guide 121 to fourth light guide 124 all have the configuration shown in part (b) of FIG. 17; however, any number of light guides may be made to have the configuration shown in part (b) of FIG. 17, and the others are made to have, for example, the configuration shown in part (a) of FIG. 17.

In the above, the input devices according to one or more aspects of the present invention are described based on the exemplary embodiment; however, the present invention is not limited to the exemplary embodiment. Configurations in which various modifications conceived by those skilled in the art are applied to the exemplary embodiment, and configurations established by combining constituent elements in different exemplary embodiments may also fall within the scope of one or more aspects of the present invention, without departing from the scope of the present invention.

INDUSTRIAL APPLICABILITY

The present invention is useful as an input device and other devices that have a compact configuration and can effectively achieve selective display of two designs.

REFERENCE MARKS IN THE DRAWINGS

2: steering wheel input device
4: automobile
6: in-vehicle equipment
8: steering wheel
12: rim
14: spoke
16: horn switch cover
18: finger
20: dashboard
100: input device
111, 211: housing 112: first operation member
113, 221: light guide
114: first supporter
115: axis body
116: second operation member
117: second supporter
118: substrate
121: first light guide
122: second light guide
123: third light guide
124: fourth light guide
125 to 128: part
131, 231: emission part
131a: curved surface part
132, 232: first light guide leg
133, 233: second light guide leg
133a: curved surface part
134: first reflection surface
135: second reflection surface
136: first step surface
137: second step surface
141: first design
141a: inclined surface
142, 242: second design
151 to 155: switch
161 to 165: light source (plurality of light sources)
161a to 165a, 261a: first light source
161b to 165b, 261b: second light source
D1: first direction
D2: second direction
D3: third direction
D4: fourth direction
D5: fifth direction

The invention claimed is:

1. An input device comprising:
a switch that is switched between on and off by being pressed;
a plurality of light sources, the plurality of light sources including:
  a first light source; and
  a second light source disposed at a position different from a position of the first light source; and
a light guide that guides light emitted from each of the plurality of light sources in an anti-pressing direction opposite to a pressing direction of the switch,
wherein the light guide includes:
  an emission part that is disposed in the anti-pressing direction from the switch and emits the light emitted by each of the plurality of light sources, in the anti-pressing direction;
  a first light guide leg that is coupled to the emission part and guides first light emitted by the first light source to the emission part; and
  a second light guide leg that is coupled to the emission part and guides second light emitted by the second light source to the emission part,
the emission part includes:
  a first design that illuminates by reflecting the first light in the anti-pressing direction; and
  a second design that illuminates by reflecting the second light in the anti-pressing direction,
the first light guide leg is a plate-shaped part and includes a first reflection surface disposed along a thickness of the first light guide leg and reflects the first light,
the second light guide leg is a plate-shaped part and includes a second reflection surface disposed along a thickness of the second light guide leg and reflects the second light, and
the first light guide leg and the second light guide leg are arranged on approximately a same plane.

2. The input device according to claim 1, wherein
the first reflection surface is a side surface of the first light guide leg and is disposed to be tilted with respect to the pressing direction when viewed from the pressing direction, and
the second reflection surface is a side surface of the second light guide leg and is disposed to be tilted with respect to the pressing direction when viewed from the pressing direction.

3. The input device according to claim 1, wherein
the first reflection surface is disposed in the anti-pressing direction from the first light source, and
the second reflection surface is disposed in the anti-pressing direction from the second light source.

4. The input device according to claim 1, wherein the first light enters the first design in a first direction, the second light enters the second design in a second direction, and the first direction and the second direction intersect each other.

5. The input device according to claim 1, wherein
the emission part is a plate-shaped part, and
the first light guide leg and the second light guide leg are coupled to the emission part through a part bent at a predetermined angle.

6. The input device according to claim 1, wherein at least a part the first design and at least a part of the second design are formed to overlap each other.

7. The input device according to claim 1, wherein the emission part includes:
at least one first step surface, wherein the at least one first step surface is disposed on an extended line in a first direction in which the first light enters the first design, the at least one first step intersects the first direction, and a side, in the first direction, of the at least one first step surface is open to outside; and
at least one second step surface, wherein the at least one second step surface is disposed on an extended line in a second direction in which the second light enters the second design, the at least one second step surface intersects the second direction, and a side, in the second direction, of the at least one second step surface is open to outside.

8. The input device according to claim 7, wherein
the at least one first step surface includes a plurality of first step surfaces,
the at least one second step surface includes a plurality of second step surfaces, and
on the emission part, the plurality of first step surfaces and the plurality of second step surfaces are alternately arranged in a third direction intersecting the first direction and the second direction.

9. The input device according to claim 7, wherein the at least one first step surface and the at least one second step surface are colored black.

10. The input device according to claim 1, wherein the switch, the first light source, and the second light source are mounted on a same wiring board.

* * * * *